(12) United States Patent
Dastidar et al.

(10) Patent No.: US 9,021,323 B1
(45) Date of Patent: Apr. 28, 2015

(54) TEST TECHNIQUES AND CIRCUITRY

(75) Inventors: Jayabrata Gosh Dastidar, Santa Clara, CA (US); Kalyana Ravindra Kantipudi, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 441 days.

(21) Appl. No.: 13/046,620

(22) Filed: Mar. 11, 2011

(51) Int. Cl.
  *G01R 31/28* (2006.01)
  *G01R 31/3185* (2006.01)
(52) U.S. Cl.
  CPC .... *G01R 31/318591* (2013.01); *G01R 31/2882* (2013.01); *G01R 31/318544* (2013.01)
(58) Field of Classification Search
  USPC .......................................................... 714/727
  See application file for complete search history.

(56) References Cited

U.S. PATENT DOCUMENTS

| | | | |
|---|---|---|---|
| 7,058,534 B1 * | 6/2006 | Tracy et al. | 702/117 |
| 2005/0268185 A1 * | 12/2005 | Vinke et al. | 714/718 |
| 2008/0126898 A1 * | 5/2008 | Pandey | 714/731 |
| 2008/0222470 A1 * | 9/2008 | Satoi et al. | 714/726 |
| 2011/0276849 A1 * | 11/2011 | Periasamy et al. | 714/731 |

OTHER PUBLICATIONS

Author: Nisar Ahmed, Mohammad Tehranipoor, C.P. Ravikumar; Title: Enhanced Launch-Off-Capture Transition Fault Testing; Publisher: IEEE 0-7803-9039-3, International Test Conference; Date: 2005.*

* cited by examiner

*Primary Examiner* — April Y Blair
*Assistant Examiner* — Thien D Nguyen
(74) *Attorney, Agent, or Firm* — Womble, Carlyle, Sandridge & Rice

(57) ABSTRACT

Circuits and a method for testing an integrated circuit (IC) are disclosed. A disclosed circuit block includes a selector circuit that is coupled to receive an enable signal and two clock signals. One of the two clock signals is selected as an output of the selector circuit based on the enable signal received. A storage element is coupled to receive the enable signal and the output of the selector circuit as a clock input signal. A logic gate is coupled to receive the output of the storage element and the enable signal. Another selector circuit is coupled to receive an output from the logic gate and the enable signal. The selector circuit selects either the output from the logic gate or the enable signal as a scan enable signal for a scan chain on the IC.

20 Claims, 6 Drawing Sheets

TEST TECHNIQUES AND CIRCUITRY

BACKGROUND

Integrated circuits (IC) devices go through a series of vigorous tests before and after production. Each device can and must be put through a rigorous industry standard test methodology to verify the quality of the device. Simple test circuits can also be embedded in an IC device to test the functionality of different parts of the device. These test circuits are usually used to carry out post-production tests to ensure that the IC device is error free and is operating as expected.

Generally speaking, design for test (DFT) is a name for design techniques or embedded circuits that are used to detect various kinds of faults on a manufactured IC device. For instance, a DFT circuit can be used to detect stuck-at faults in a logic block on the IC device.

Scan chains, typically formed by connecting logic elements such as flip flops and other storage elements in series, are integrated into the device to test the device for various logic defects. A scan chain can be configured to receive a set of test vectors that can be used to test the functionality of the particular device. Typically, the device is allowed to operate using the set of test vectors for at least several clock cycles before the data from the scan chain is read to determine the functionality of the device.

In a typical scan test, two fast clock transitions are needed. The first transition launches the test value and the second transition captures the result based on the test value. Two of the more common scan test methods are launch-on-capture (LOC) and launch-on-shift (LOS). Even though LOC scan test is commonly used, the LOC scan test may not be able to capture every stage of registers in the scan chain at-speed. In this aspect, the LOS scan test may be a better option because all stages of registers can be tested at-speed with the LOS scan test. Even though the LOS scan test is a better scan technique as compared to the LOC scan test, in an LOS scan test, the scan enable signal that is used to put the scan chain into a "scan mode" needs to be routed as a clock, which generally requires more area on the IC device.

SUMMARY

Accordingly, it is desirable to have scan chains that are configurable to perform either an LOC or an LOS test as desired. It is also desirable to have a simple localized scan chain circuit that can provide a cost-effective testing technique. Embodiments include circuits and techniques to achieve at-speed testing in an integrated circuit (IC).

It is appreciated that the present exemplary embodiments can be implemented in numerous ways, such as a process an apparatus, a system, a device or a method on a computer readable medium. Several inventive embodiments of the present invention are described below.

In one embodiment, a circuit block is disclosed. The circuit block includes a first selector circuit coupled to receive two clock signals and an enable signal. The first selector circuit outputs one of the two clock signals based on the enable signal. A storage element is coupled to receive the enable signal and the output of the first selector circuit as a clock input signal. A logic gate is coupled to receive an output from the storage element and the enable signal. A second selector circuit is then coupled to receive the output from the logic gate and the enable signal. The second selector circuit outputs either the output from the logic gate or the enable signal as a scan enable signal. In one embodiment, the scan enable signal is coupled to a scan chain.

In yet another embodiment an IC is provided. The IC includes a scan chain coupled to receive a scan enable signal and a storage element generating a clocked output based on an enable signal and a clock signal. A logic circuit is coupled to receive the enable signal and the clocked output from the storage element. A selector circuit then outputs one of the enable signal and an output from the logic circuit as the scan enable signal for the scan chain.

In an alternative embodiment in accordance with the present invention, a method of testing a circuit is provided. The method includes receiving two clock signals. One of the two clock signals is then selected as a clock input signal based on a first enable signal. The first enable signal is clocked with one of the clock signals to generate a second enable signal. The second enable signal transitions from a first logic level to a second logic level when the original enable signal is at the second logic level and upon the transition of the clock signal from the second logic level to the first logic level. Either the second enable signal or the first enable signal is selected as a scan enable signal for a scan chain in the circuit.

Other aspects will become apparent from the following detailed description, taken in conjunction with the accompanying drawings, illustrating by way of example the principles of the exemplary embodiments.

BRIEF DESCRIPTION OF THE DRAWINGS

The invention may best be understood by reference to the following description taken in conjunction with the accompanying drawings.

DETAILED DESCRIPTION

Exemplary embodiments include circuits and techniques to achieve at-speed testing in an integrated circuit (IC). It is appreciated that at-speed testing refers to testing techniques that generally require test clock signals to be generated at the system speed or the operating speed of the device. It is appreciated that the Figures described herein are merely illustrative and not intended to limit the scope of the present invention.

It will be obvious, however, to one skilled in the art, that the present embodiments may be practiced without some or all of these specific details. In other instances, well-known operations have not been described in detail in order not to unnecessarily obscure the exemplary embodiments.

Manufactured ICs are tested with electronic design automation (EDA) tools with design and test techniques collectively known as design for test (DFT). Generally, scan chains, formed by serially connecting scan elements, e.g., flip flops, registers, and other storage elements, are included in an IC as a DFT feature. These scan chains can include different selectable modes. For instance, a scan chain can include a "scan mode" and a "normal mode". When the scan chain is in "normal mode", the scan chain will perform the intended functionality of the device normally. When the scan chain is in "scan mode" the scan chain is configured to serially receive and output data.

Figure 1A:
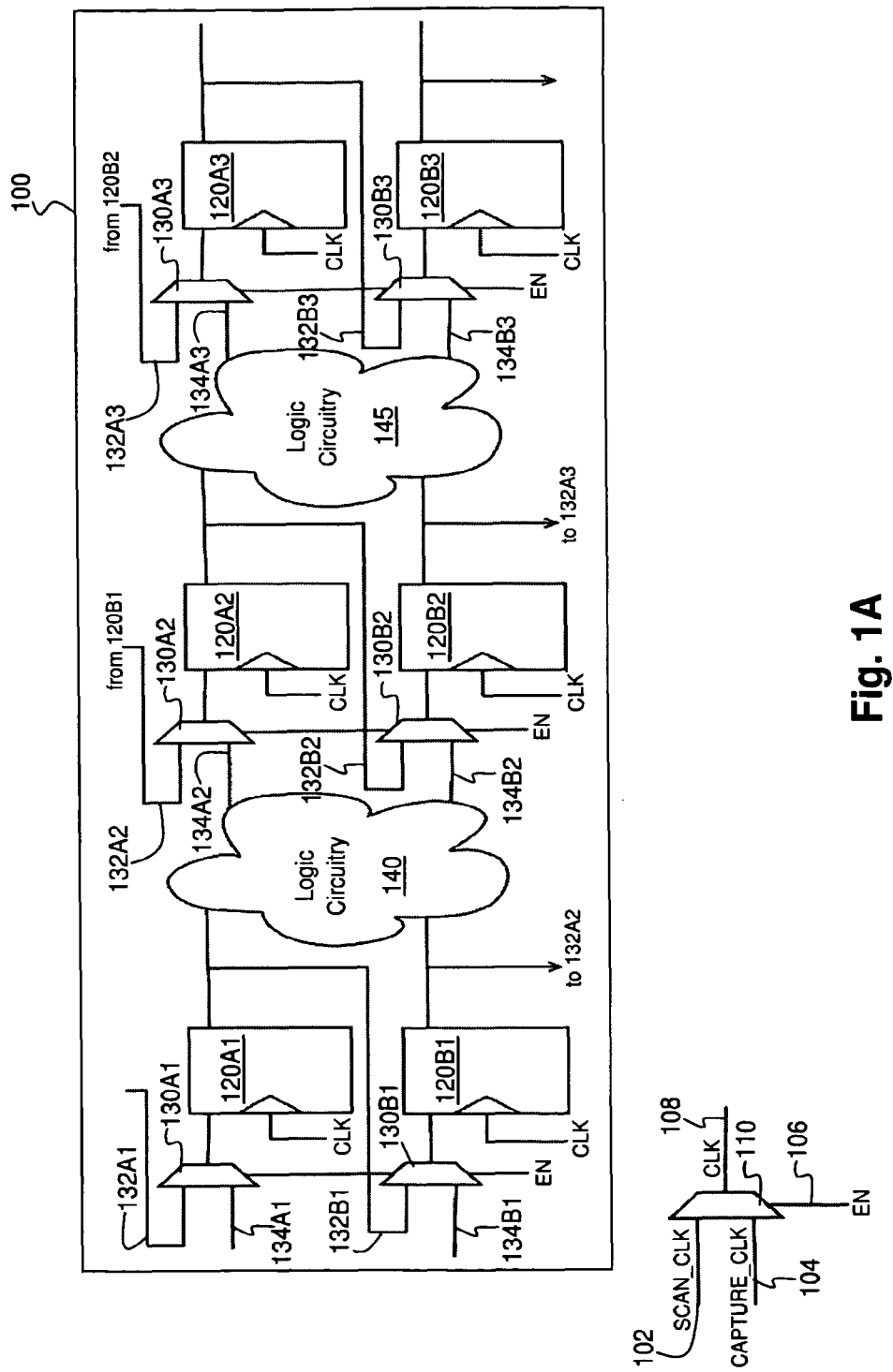
FIG. 1A shows an exemplary scan chain in accordance with one embodiment of the present invention.

FIG. 1A, shows an exemplary scan chain 100 in accordance with one embodiment of the present invention. It is appreciated that storage elements described herein may refer to any storage element, e.g., registers, flip flops, latches, etc. Even though only six storage elements 120A1-120B3 are shown in the embodiment of FIG. 1A, it is appreciated that fewer or more storage elements may be connected together to form a scan chain. In scan chain 100, the storage elements are coupled such that they form multiple stages in scan chain 100 e.g., storage elements 120A1 and 120B1 form a first stage of registers, storage elements 120A2 and 120B2 form a second stage of registers, and so on and so forth. Generally, there is logic circuitry in between every stage of registers. For instance in one embodiment the logic circuitry 140 is between the first stage of registers and the second stage of registers. Similarly, logic circuitry 145 may be between the second stage of registers and the third stage of registers. Logic circuitry 140 and 145 may include, among others, combinatorial logic circuitry, multipliers, etc., that are used to perform a variety of functions.

Referring still to FIG. 1A, selector circuits 130A1-130B3 are placed at an input terminal of every corresponding storage element 120A1-120B3. Each of the selector circuits 130A1-130B3 selects between the two input signals and outputs the result to the corresponding storage element. For example, selector circuit 130A2 selectively outputs either the output from storage element 120B1 at input terminal 132A2 or an output from logic circuitry 140 at input terminal 134A2 to storage element 120A2. Likewise, selector circuit 130B2 selectively outputs either the output from storage element 120A2 at input terminal 132B2 or an output from logic circuitry 140 at input terminal 134B2 to storage element 120B2. Every selector circuit 130A1-130B3 in scan chain 100 selects one of the two input signals and outputs the selected signal to each respective storage element 120A1-120B3 based on an enable signal, EN, coupled to the select terminal of every selector circuit 130A1-130B3.

Referring still to FIG. 1A, the storage elements 120A1-120B3 may be clocked by a clock signal 108, CLK, received at the clock input terminal of storage elements 120A1-120B3. In one embodiment, the storage elements 120A1-120B3 are triggered by edges of the received CLK signal 108. The CLK signal 108 is selectively output by selector circuit 110 based on the enable signal, EN, received at input terminal 106 of selector circuit 110. Two clock signals, SCAN_CLK and CAPTURE_CLK, coupled to input terminals 102 and 104, respectively, are selectively output as a clock signal 108, CLK, to scan chain 100.

According to one embodiment when the scan enable, EN, signal is at an active low level, the scan clock, SCAN_CLK is outputted to the clock input of registers 120A1-120B3 as the clocking signal. As a result, values, e.g., test vectors, are scanned into scan chain 100 at input terminal 132A1 and propagated through the rest of the scan chain. It is appreciated that input terminal 132A1 can be coupled to another storage element, an input pin or an external source. Two of the more common scan techniques to test a scan chain such as scan chain 100 are Launch-on-Capture (LOC) and Launch-on-Shift (LOS). Depending on how the enable signal, EN, is routed to scan chain 100, either an LOC or an LOS scan technique can be implemented on scan chain 100. For instance, in an LOS scan run, the enable signal, EN, is routed as a clock signal, e.g., routed through a clock network on an IC.

In LOC implementation, the first transition, i.e., the launch transition, captures a value propagated from a first stage of registers in the scan chain and the second transition, i.e., the capture transition, captures the value propagated from a second stage of registers into a third stage of registers in the scan chain. As such, in an LOC scan test, the value is propagated at-speed from the second stage of registers onwards.

Figure 1B:
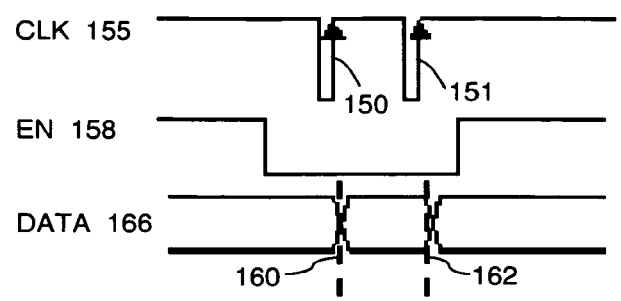
FIG. 1B shows an exemplary timing diagram of an LOC scan run in accordance with one embodiment of the present invention.

FIG. 1B shows an exemplary timing diagram of an LOC scan run in accordance with one embodiment of the present invention. Waveform 155 is an exemplary waveform of a clock signal, CLK. CLK waveform 155 shows two fast transitions, 150 and 151. The first transition 150 is a launch transition and the second transition 151 is a capture transition. The launch transition 150 captures the propagated values from a first stage of registers, e.g., registers 120A1 and 120B1 of FIG. 1A, through logic circuitry 140 into a second stage of registers, e.g., registers 120A2 and 120B2. The capture transition 151 then captures propagated values from the second stage of registers into a third stage of registers, e.g., registers 120A3 and 120B3 of FIG. 1A, at-speed. Waveform 158 shows the scan enable signal, EN, transitioning from a logic high level to a logic low level and remains at the logic low level during the two fast CLK transitions 150 and 151. Data waveform 166 shows two data transition windows, i.e., slow capture transition window 160 and at-speed capture transition window 162 based on the two CLK transitions 150 and 151 as described above.

Figure 1C:
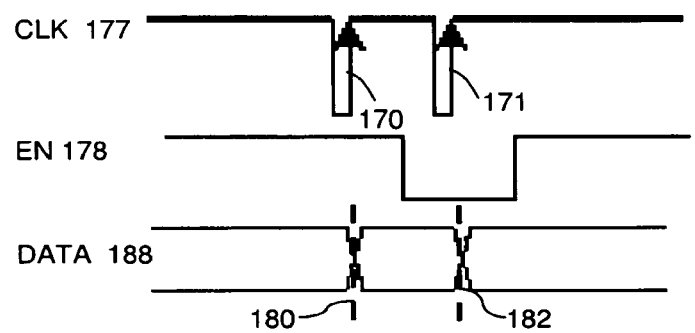
FIG. 1C shows an exemplary timing diagram of an LOS scan run in accordance with one embodiment of the present invention.

FIG. 1C shows an exemplary timing diagram of an LOS scan run in accordance with one embodiment of the present invention. In LOS implementation, the scan chain is first loaded at a slow clock rate before applying two clock pulses at the functional frequency. The scan enable signal that puts the scan chain into a "scan mode" should also be activated in between the two at-speed transitions. CLK waveform 177 shows two clock transitions, 170 and 171. The first transition, launch transition 170, captures values from an earlier stage of registers in the scan chain and the second transition, capture transition 171, captures the propagated values from the earlier stage of registers at-speed. Data waveform 188 shows data windows 180 and 182, representing data from the earlier stage of registers and at-speed captured data, respectively. In an LOS scan run, the scan enable signal, EN, shown as waveform 178, transitions from a logic high level to a logic low level after the launch transition 170 but before the capture transition 171. In other words, the scan enable signal, EN, transitions in between the two data windows 180 and 182.

It is appreciated that the scan enable signal, EN, is routed as a clock signal, e.g., routed through a clock network on an IC, in an LOS scan run. However, it may be difficult to route the scan enable signal, EN, through a clock network on the IC. The embodiments herein describe techniques to route the enable signal more effectively for an LOS implementation, enabling an LOC scan run to be implemented on a single scan chain as desired.

Figure 2:
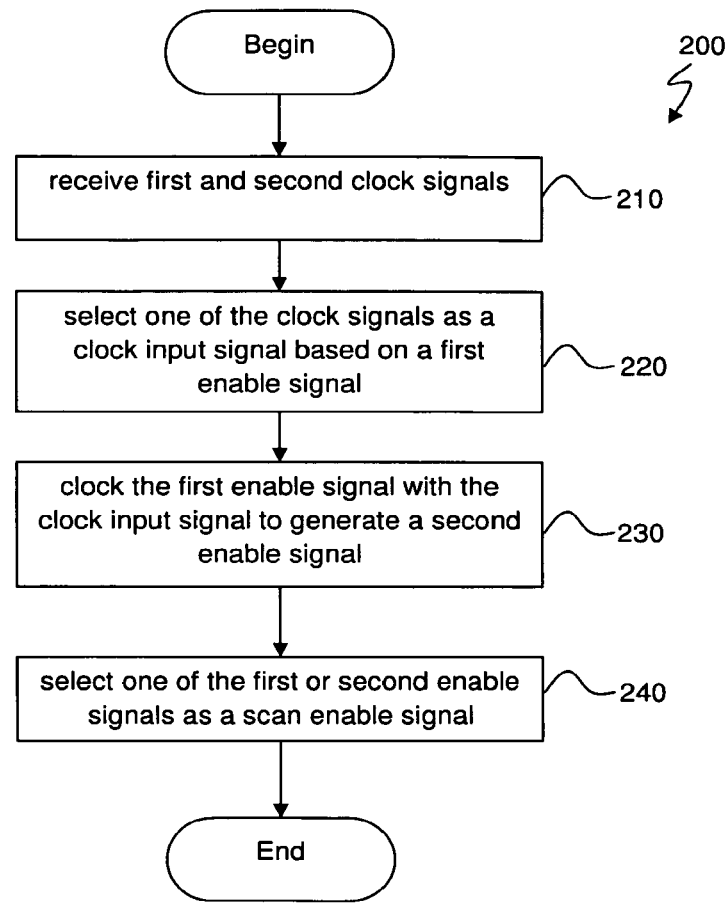
FIG. 2 shows an exemplary method for testing an IC in accordance with one embodiment of the present invention.

FIG. 2 shows an exemplary method 200 for testing an IC in accordance with one embodiment of the present invention. Flow 200 begins by receiving two clock signals in operation 210. At step 220, one of the clock signals is selected as a clock input signal based on a first enable signal. The first enable signal is clocked with the clock input signal in operation 230 to generate a second enable signal. According to one embodiment, the second enable signal transitions from a logic high level to a logic low level when the first enable signal is at a logic low level and also when the clock input signal transitions from a logic low level to a logic high level. At step 240, the first enable signal or the second enable signal is selected as a scan enable signal for a scan chain in the IC. According to one embodiment, the scan enable signal is selected based on a configuration random access memory (CRAM) bit. According to another embodiment, the scan enable signal is selected according to bits stored in a configuration shift register (CSR) that is used to configure the IC. As an exemplary embodiment, the scan chain is similar to scan chain 100 of FIG. 1A and a test vector is shifted though the scan chain.

Figure 3:
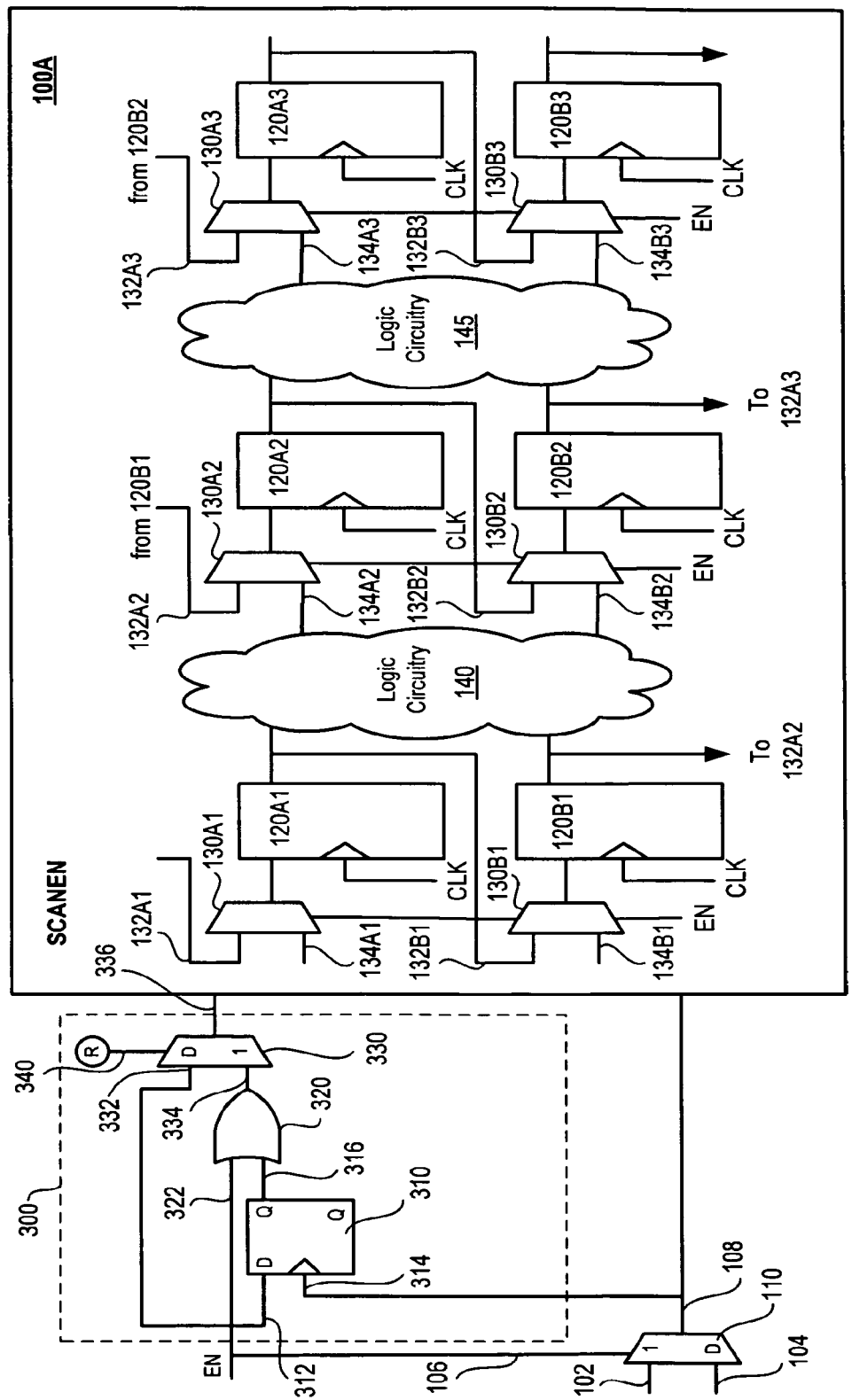
FIG. 3 shows an exemplary design for test (DFT) block coupled to a scan chain in accordance with one embodiment of the present invention.

FIG. 3 shows an exemplary design for test (DFT) block 300 coupled to scan chain 100A in accordance with one embodiment of the present invention. It is appreciated that scan chain 100A operates substantially similar to the scan chain 100 of FIG. 1A. DFT block 300 includes a storage element 310, a logic gate 320 and a selector circuit 330. Two clock signals, i.e., scan clock and capture clock, are coupled to input terminals 102 and 104 of selector circuit 110. As explained above, selector circuit 110 selects one of the two clock signals as a clock signal output 108 based on the scan enable signal, EN, received at selector terminal 106.

Referring still to FIG. 3, scan enable signal, EN, is coupled to storage element 310, logic gate 320 and selector circuit 330. The clock signal from the output 108 of selector circuit 110 is coupled to the clock terminal of storage element 310. Enable signal, EN, at input terminal 312 is clocked by the rising edges of the clock signal at clock terminal 314. For consistency, rising clock edges are used as the active clock edges herein. However, it is appreciated that falling clock edges can also be used as the active clock edges in many instances. The clocked enable signal 316 is coupled to logic gate 320. In this embodiment an OR gate 320 is used. However it is appreciated that other functionally equivalent logic gates may be used. As such, the use of the OR gate is merely exemplary and not intended to limit the scope of the present invention.

Output 334 of logic gate 320 is coupled to selector circuit 330. The selector circuit 330 selects either the output 334 from logic gate 320 or the enable signal, EN, coupled at input terminal 332. The selected signal, SCANEN, by the selector circuit 330 is output at output terminal 336. The output 336, SCANEN, is selected based on the input signal received at select terminal 340 of selector circuit 330. In this embodiment the select terminal 340 is coupled to a CRAM bit that controls the configuration of DFT block 300. SCANEN at output 336 is coupled to the selector circuits in the scan chain 100A. Depending on the configuration of the CRAM bit, scan chain 100A can be configured to run either an LOC or an LOS scan test. In one embodiment, an LOS scan is performed when the CRAM bit is set to a logic high level. In another embodiment, an LOC scan is performed when the CRAM bit is set to a logic low level. Even though a CRAM bit is shown, it is appreciated that scan chain 100A is configurable with other relevant configuration bits in this context. In one exemplary embodiment, when performing an LOS scan test, the scan enable signal, EN, is clocked within DFT block 300 instead of being clocked with a global clock signal. As a result of clocking the scan enable signal within the DFT block 300, the overhead cost associated with routing the scan enable signal as a global clock signal is reduced.

Figure 4:
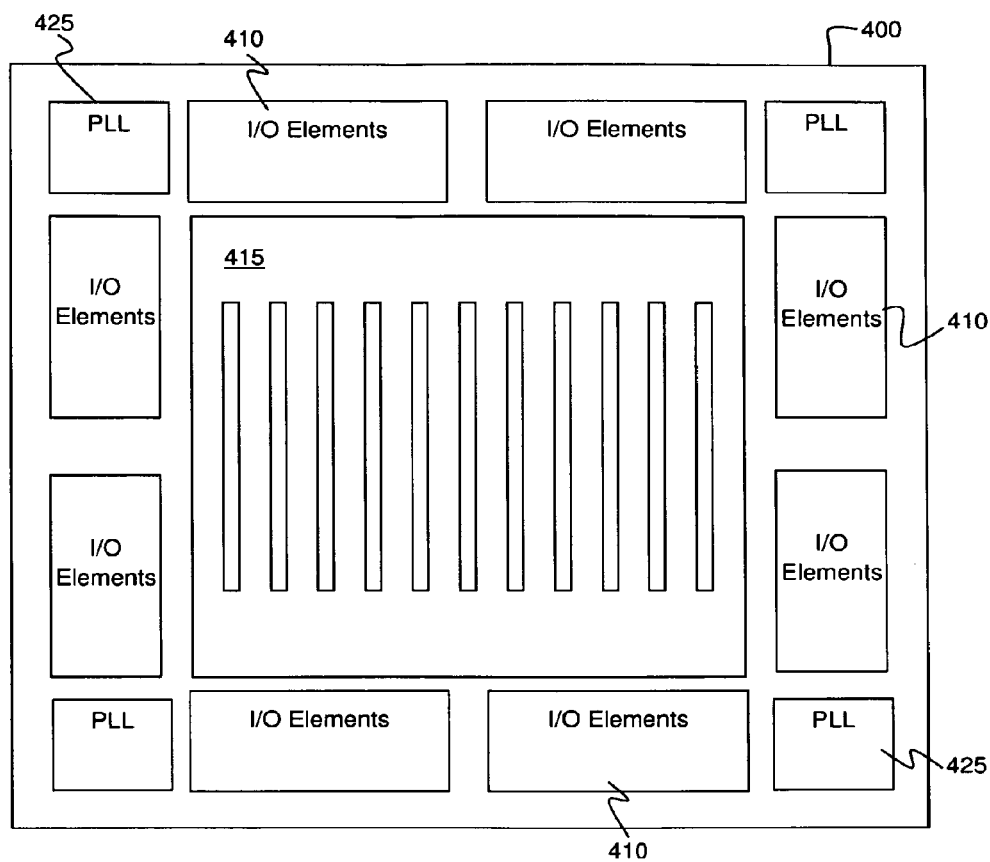
FIG. 4 shows an exemplary block diagram of a programmable logic device (PLD) that can implement various embodiments in accordance with the present invention.

FIG. 4 shows an exemplary block diagram of PLD 400 that can implement various embodiments in accordance with the present invention. Programmable device 400 includes logic region 415 and I/O elements 410. I/O elements 410 may support a variety of memory interfaces. Other auxiliary circuits such as phase-locked loops (PLLs) 425 for clock generation and timing, can be located outside the core logic region 415, e.g., at corners of programmable device 400 and adjacent to I/O elements 410. Logic region 415 may be populated with logic cells which include, among other things, at the most basic level, "logic elements" (LEs), or at a more complex level, programmable intellectual property (IP) blocks. It should be appreciated that proprietary configuration data for various commonly-used functions is frequently referred to as "IP cores". LEs may include look-up table-based logic regions and these logic elements may be grouped into "Logic Array Blocks" (LABs). The logic elements and groups of logic elements or LABs can be configured to perform logical functions desired by the user. Logic region 415 may also include DFT blocks and scan chains that are configurable to run either an LOC or an LOS scan test similar to DFT block 300 and scan chain 100A of FIG. 3.

Figure 5:
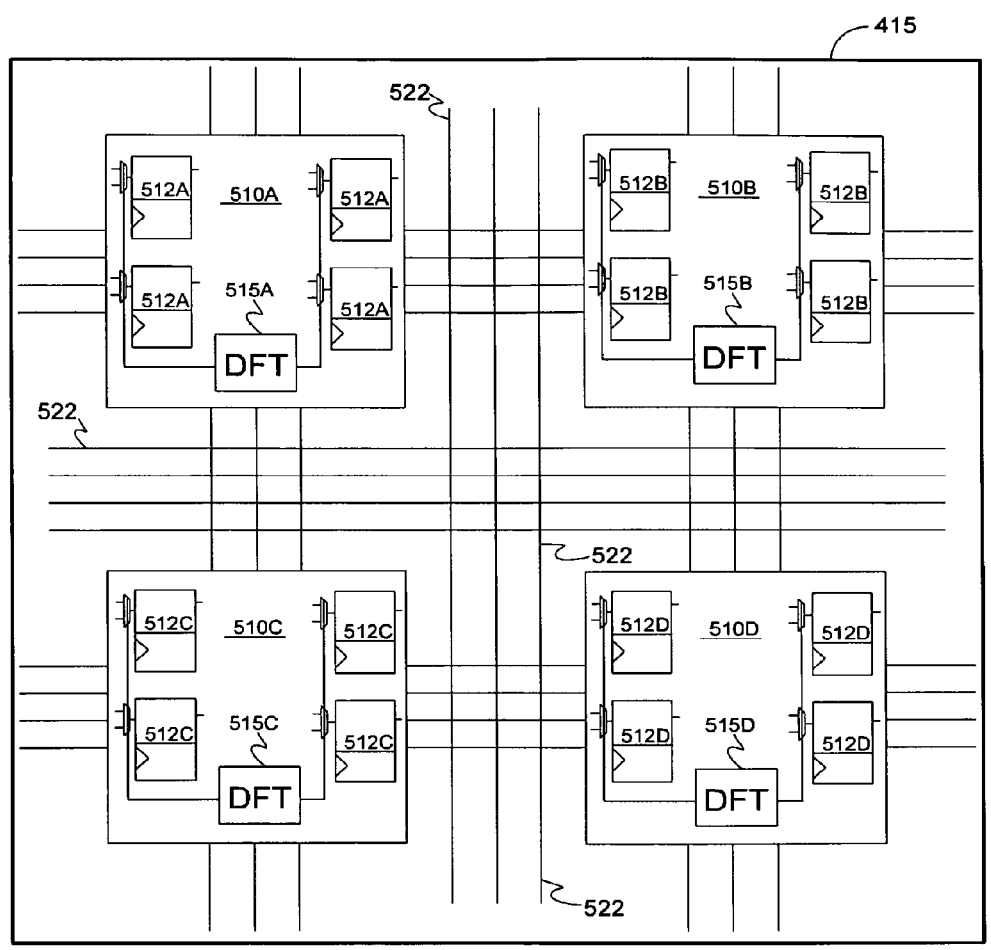
FIG. 5 shows a more detailed representation of a logic region on the PLD of FIG. 4 with interconnect lines and DFT blocks in accordance with one embodiment of the present invention.

FIG. 5 shows a more detailed representation of logic region 415 on the PLD 400 of FIG. 4 with interconnect lines 522 and DFT blocks 515A-515D in accordance with one embodiment of the present invention. Logic blocks 510A-510D may be LEs, LABs, IP blocks or any logic elements that are grouped and configured to perform specific functions. Each logic block 510A-510D is connected to one another through interconnect lines 522. DFT blocks 515A-515D are placed within logic blocks 510A-510D, respectively. According to one embodiment, each of DFT blocks 515A-515D is similar to DFT block 300 with selector circuit 110 of FIG. 3. In the embodiment of FIG. 5, each DFT block 515A-515D is used to test interconnect lines 522 within logic region 415. Signals from interconnect lines 522 that are received by each of logic blocks 510A-510D are clocked by DFT blocks 515A-515D, respectively. In the illustrative embodiment of FIG. 5, each of logic blocks 510A-510D includes multiple logic elements 512A-512D that may be coupled to perform a variety of logic functions. It should be appreciated that other elements that may be present in each of logic blocks 510A-510D and within logic region 415 are not shown in order not to unnecessarily obscure the present invention. It should also be appreciated that more or fewer logic blocks 510A-510D may be present in logic region 415.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit block comprising:
a first selector circuit coupled to receive first and second clock signals and an enable signal, wherein the first selector circuit outputs the first clock signal or the second clock signal based on the enable signal, and wherein the enable signal is an input to the circuit block;
a storage element coupled to receive an output of the first selector circuit as a clock input signal, wherein the storage element is further coupled to receive the enable signal as a direct input to the storage element, and wherein the storage element receives the enable signal without a logic gate and gate delay between the enable signal and the storage element;
a logic gate coupled to receive an output from the storage element, wherein the logic gate is further coupled to receive the enable signal; and
a second selector circuit coupled to receive an output from the logic gate as a direct input to the second selector circuit, wherein the second selector circuit is further coupled to receive the enable signal, wherein the second selector circuit outputs a scan enable signal.

2. The circuit block of claim 1 further comprising:
a scan chain coupled to receive the scan enable signal and the clock input signal from the first selector circuit.

3. The circuit block of claim 2, wherein the scan chain comprises:
a plurality of storage elements coupled together to form a plurality of stages of storage elements; and
a plurality of selector circuits, wherein each selector circuit of the plurality of selector circuits is associated with a corresponding storage element of the plurality of storage elements and coupled to an input terminal thereto, wherein each selector circuit of the plurality of selectors circuits selectively couples one of a test vector or a user input vector to storage element associated therewith based on the scan enable signal to test a logic circuitry.

4. The circuit block of claim 1, wherein the second selector circuit is coupled to a configurable memory bit, and wherein the second selector circuit outputs the enable signal or the output from the logic gate based on the configurable memory bit.

5. The circuit block of claim 1, wherein the first clock signal is a scan clock signal and the second cock signal is a capture clock signal.

6. The circuit block of claim 1 integrated in a programmable logic device (PLD).

7. The circuit block of claim 6 comprising:
a plurality of interconnect lines on the PLD.

8. An integrated circuit (IC) comprising:
a storage element that generates a clocked output based on an enable signal and a clock signal, the enable signal a direct input to the storage element without a logic gate between the enable signal and the storage element;
a logic circuit coupled to receive the enable signal and the clocked output from the storage element; and
a first selector circuit outputting one of the enable signal and an output from the logic circuit as a scan enable signal for a scan chain, each of the enable signal and the output from the logic circuit a direct input to the first selector circuit, without a logic gate between the enable signal and the first selector circuit and without a logic gate between the output from the logic circuit and the first selector circuit.

9. The IC of claim 8, wherein the logic circuit includes an OR gate.

10. The IC of claim 8, wherein a select terminal of the first selector circuit is coupled to one of a configuration random access memory (CRAM) bit or a configuration shift register (CSR).

11. The IC of claim 8 further comprising:
a second selector circuit coupled to receive first and second clock signals, wherein the second selector circuit selects one of the first or second clock signals as a clock input signal received at the storage element based on the enable signal.

12. The IC of claim 11, wherein the first clock signal is a scan clock signal and the second clock signal is a capture clock signal.

13. The IC of claim 8, wherein the scan chain is coupled to receive a test vector.

14. The IC of claim 8, wherein the scan enable signal is coupled to an enable input of a plurality of selector circuits in the scan chain.

15. A method of testing a circuit comprising:
receiving first and second clock signals;
selecting the first clock signal or second clock signal as a clock input signal based on a first enable signal;
clocking the first enable signal with the clock input signal to generate a second enable signal, wherein the first enable signal is a direct input, without gating or gate delay, to a storage element, wherein the second enable signal is a logical combination of an output of the storage element and the direct input to the storage element, and wherein the second enable signal transitions from a first logic level to a second logic level when the first enable signal is at the second logic level and upon transition of the clock input signal from the second logic level to the first logic level; and
selecting, via a selector having the first enable signal and the second enable signal coupled without gating or gate delay as direct inputs thereto, the first enable signal or the second enable signal as a scan enable signal for a scan chain in the circuit.

16. The method of claim 15, wherein the second enable signal transitions from the second logic level to the first logic level when the first enable signal transitions from the second logic level to the first logic level.

17. The method of claim 15, wherein the selecting the first enable signal or the second enable signal is based on a configuration random access memory (CRAM) bit.

18. The method of claim 15 further comprising:
shifting a test vector through the scan chain, wherein a first transition of the test vector captures a value from a previous stage of registers in the scan chain, wherein a second transition of the test vector captures the value propagated from the previous stage of registers at a subsequent stage of registers at-speed.

19. The method of claim 18, wherein the first transition is a launch transition and the second transition is a capture transition.

20. The method of claim 19, wherein the second enable signal transitions from the first logic level to the second logic level right prior to the capture transition.

* * * * *